United States Patent
Koizumi

(10) Patent No.: US 7,052,975 B2
(45) Date of Patent: May 30, 2006

(54) SEMICONDUCTOR CHIP AND FABRICATION METHOD THEREOF

(75) Inventor: Naoyuki Koizumi, Nagano (JP)

(73) Assignee: Shinko Electric Industries Co., Ltd., Nagano (JP)

(*) Notice: Subject to any disclaimer, the term of this patent is extended or adjusted under 35 U.S.C. 154(b) by 135 days.

(21) Appl. No.: 10/642,936

(22) Filed: Aug. 18, 2003

(65) Prior Publication Data

US 2004/0043614 A1  Mar. 4, 2004

(30) Foreign Application Priority Data

Sep. 2, 2002 (JP) .............. 2002-256767

(51) Int. Cl.
  *H01L 21/46* (2006.01)
  *H01L 21/78* (2006.01)
  *H01L 21/301* (2006.01)
(52) U.S. Cl. .............. 438/460; 438/462
(58) Field of Classification Search ........ 438/460, 438/464, 462
See application file for complete search history.

(56) References Cited

U.S. PATENT DOCUMENTS

| 3,642,597 | A | * | 2/1972 | Sheldon ............... 438/460 |
| 4,325,182 | A | | 4/1982 | Tefft et al. |
| 4,729,971 | A | * | 3/1988 | Coleman ............... 438/462 |
| 5,904,546 | A | * | 5/1999 | Wood et al. ............ 438/460 |
| 5,972,781 | A | * | 10/1999 | Wegleiter et al. ........ 438/460 |
| 5,998,238 | A | | 12/1999 | Kosaki |
| 2002/0145827 | A1 | * | 10/2002 | Bunch et al. ........... 360/235.1 |

FOREIGN PATENT DOCUMENTS

| JP | 55 156336 | 12/1980 |
| JP | 4 67650 | 3/1992 |
| JP | 09-029472 | 2/1997 |
| JP | 2000-164728 | 6/2000 |
| JP | 2001-007092 | 1/2001 |

* cited by examiner

*Primary Examiner*—Carl Whitehead, Jr.
*Assistant Examiner*—Heather Doty
(74) *Attorney, Agent, or Firm*—Ladas & Parry LLP

(57) ABSTRACT

A semiconductor chip and a fabrication method thereof are disclosed. In the fabrication method, isotropic etching and anisotropic etching are performed on a cutting portion of a semiconductor wafer to form grooves in the semiconductor wafer. Through these grooves, the semiconductor wafer can be diced with no use of any dicing blade. In addition, it is possible to form semiconductor chips whose edges and corners are rounded off. According to the fabrication method, fabrication time can be shorten. In addition, it is possible to improve integration and yield of semiconductor chip formation.

6 Claims, 4 Drawing Sheets

SEMICONDUCTOR CHIP AND FABRICATION METHOD THEREOF

BACKGROUND OF THE INVENTION

1. Field of the Invention

The present invention is related to a method of fabricating semiconductor chips by dicing a semiconductor wafer at a predetermined size.

2. Description of the Related Art

In a conventional semiconductor chip fabrication process, a semiconductor wafer, on which a plurality of semiconductor elements are formed, is diced in a dicing process of the fabrication process by shifting a rotationally-driven disk-shaped cutter (dicing blade) of a semiconductor chip fabrication apparatus vertically and horizontally so as to form a large number of semiconductor chips. In general, such semiconductor chips are box-shaped.

In the above-mentioned conventional semiconductor chip fabrication process, since a dicing blade of a semiconductor chip fabrication apparatus is shifted vertically and horizontally to dice a semiconductor wafer, the semiconductor chip fabrication apparatus has to perform a greater number of cutting operations as more semiconductor chips are formed from the semiconductor wafer. Thus, it takes more dicing time to produce more semiconductor chips.

In addition, when a dicing blade is used in the dicing process, it is necessary to prepare a passage area (dicing line width) for the dicing blade between adjacent semiconductor chips in a semiconductor wafer. In general, an interval between adjacent semiconductor chips has to be set as more than the dicing line width of about 50 µm, and this requirement adversely influences high-density semiconductor chip formation on a semiconductor wafer. Furthermore, a semiconductor wafer has been recently made thinner down to about 50 µm. Such a thin semiconductor wafer is fragile to a dicing blade.

In addition, when a semiconductor wafer is diced to form semiconductor chips, the diced semiconductor chips are box-shaped. Such a box-shaped semiconductor chip has a significant problem in that a corner and an edge of the semiconductor chip may be chipped when the semiconductor chip is handled or carried, resulting in yield reduction thereof.

SUMMARY OF THE INVENTION

It is a general object of the present invention to provide a novel and useful semiconductor chip and fabrication method thereof in which one or more of the above-mentioned problems are eliminated.

A more specific object of the present invention is to provide a method of fabricating a semiconductor chip that can shorten fabrication time and improve integration and yield of semiconductor chip formation.

In order to achieve the above-mentioned objects, there is provided according to one aspect of the present invention a method of fabricating a semiconductor chip from a semiconductor wafer having a first surface supporting a semiconductor element and a second surface opposite the first surface, the method including the steps of: performing isotropic etching at least partially on a cutting portion of the semiconductor wafer from one or both of the first surface and the second surface; and performing anisotropic etching on a remaining portion of the cutting portion from the one or both of the first surface and the second surface, thereby cutting the cutting portion of the semiconductor wafer.

In an embodiment of the present invention, the method may further include the step of: forming a resist on the first surface to expose the cutting portion on the first surface, when the cutting portion is isotropically etched from the first surface.

In an embodiment of the present invention, the resist may have rounded-off corners.

In an embodiment of the present invention, the method may further include the step of: forming a resist on the second surface to expose the cutting portion on the second surface, when the cutting portion is isotropically etched from the second surface.

In an embodiment of the present invention, the resist may have rounded-off corners.

Additionally, there is provided according to another aspect of the present invention a semiconductor chip fabricated from a semiconductor wafer, including: a first surface supporting a semiconductor element; a second surface opposite the first surface, wherein at least one of the first surface and the second surface has rounded-off edges.

In an embodiment of the present invention, the semiconductor chip may further include notched side surfaces.

Additionally, there is provided according to another aspect of the present invention a semiconductor chip fabricated from a semiconductor wafer, including: a plurality of rounded-off corners.

According to one aspect of the present invention, when a semiconductor wafer is diced, it is possible to etch the surfaces of the semiconductor wafer by performing isotropic etching and anisotropic etching. Accordingly, it is possible to shorten time required to fabricate semiconductor chips from the semiconductor wafer. In addition, since the semiconductor chip fabrication method according to the present invention does not need a dicing blade for dicing a semiconductor wafer, it is unnecessary to prepare a dicing line width corresponding to a dicing blade and reduce the dicing line width. As a result, it is possible to enhance integration of semiconductor chips on the semiconductor wafer, that is, it is possible to produce more semiconductor chips from the semiconductor wafer. In addition, since isotropic etching may be performed on a cutting portion from a first surface, on which at least one semiconductor element is formed, of a semiconductor wafer or a second surface opposite the first surface, it is possible to round off one or both edges of the first surface and the second surface. This configuration makes it possible to prevent chipping of the edge when the semiconductor chip is handled, and it is possible to improve yield of semiconductor chips.

Other objects, features and advantages of the present invention will become more apparent from the following detailed description when read in conjunction with the accompanying drawings.

DETAILED DESCRIPTION OF THE PREFERRED EMBODIMENTS

In the following, embodiments of the present invention will be described with reference to the accompanying drawings.

Figure 1:
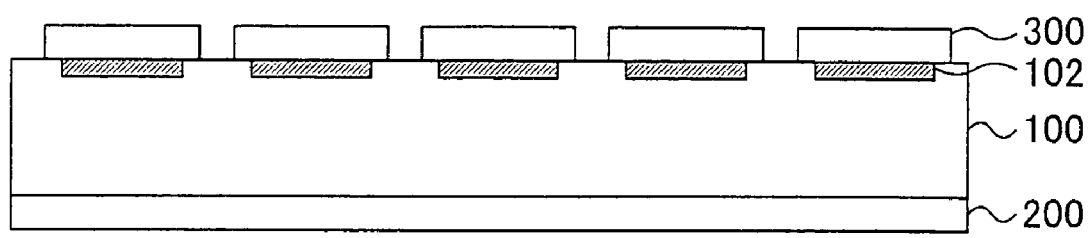
FIG. 1 is a diagram illustrating a first fabrication process of a semiconductor chip according to an embodiment of the present invention.

FIG. 1 shows a first fabrication process of a semiconductor chip according to an embodiment of the present invention. In the first fabrication process, a semiconductor chip fabrication apparatus fixes a semiconductor wafer 100, which is made of silicon and includes two surfaces: an element formation surface (upper side in FIG. 1) having a plurality of semiconductor elements 102 thereon and an element non-formation surface (lower side in FIG. 1) opposite to the element formation surface, by attaching the element non-formation surface of the semiconductor wafer 100 to a tape 200 as illustrated in FIG. 1.

In addition, the semiconductor chip fabrication apparatus provides a resist film on the element formation surface. Then, by exposing the resist film to light, the semiconductor chip fabrication apparatus removes the portion of the resist film on a cutting area of the semiconductor wafer 100. Specifically, if the resist film is a positive resist, the semiconductor chip fabrication apparatus provides a mask having a plurality of rectangular holes above the resist film. This mask is designed to expose a portion to be left of the resist film. The semiconductor chip fabrication apparatus illuminates light on the resist film through the mask from above and then dissolves the resist film. As a result, it is possible to remove only the portion of the resist film where the light is not illuminated. On the other hand, if the resist film is a negative resist, the semiconductor chip fabrication apparatus provides a mask having a plurality of rectangles above the resist film. This mask is designed to expose a portion to be removed of the resist film. The semiconductor chip fabrication apparatus illuminates light on the resist film through the mask from above and then dissolves the resist film. As a result, it is possible to remove the portion of the resist film where the light was illuminated.

Figure 2:
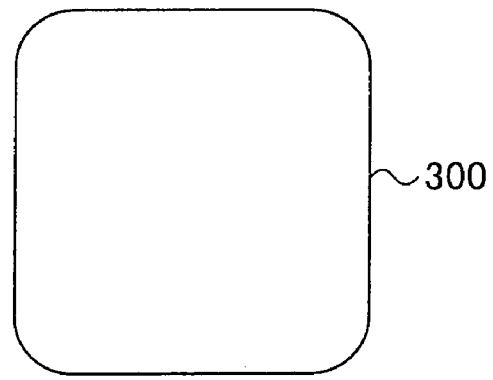
FIG. 2 is a top view of a resist used in the first fabrication process according to the embodiment.

When the resist film on the cutting portion of the semiconductor wafer 100 is removed in this manner, resists 300 to expose the cutting portion of the semiconductor wafer 100 are formed on the semiconductor wafer 100. FIG. 2 is a top view of a resist 300. As shown in FIG. 2, the four corners of the resist 300 are rounded off. In a positive-type resist film, such a resist film 300 can be formed by rounding off four corners of each hole on the above-mentioned mask for the positive resist. In a negative-type resist film, on the other hand, such a resist film 300 can be formed by rounding off four corners of each rectangular of the above-mentioned mask for the negative resist.

Figure 3:
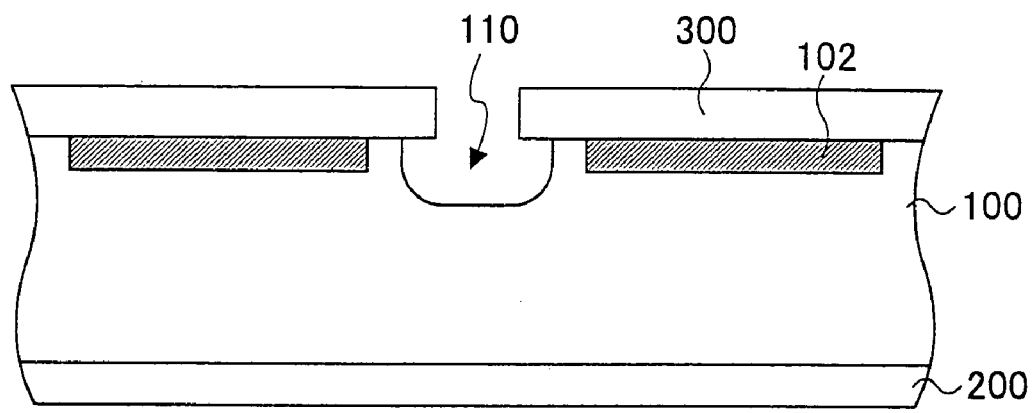
FIG. 3 is a diagram illustrating a second fabrication process of the semiconductor chip according to the embodiment.

FIG. 3 shows a second fabrication process of the semiconductor chip according to the embodiment of the present invention. In the second fabrication process, the semiconductor chip fabrication apparatus performs an isotropic etching for the exposed portion of the semiconductor wafer 100, that is, the cutting portion of the semiconductor wafer 100. Specifically, the semiconductor chip fabrication apparatus exposes the semiconductor wafer 100 in atmosphere of a reactive gas.

The reactive gas is absorbed by the exposed portion of the semiconductor wafer 100 and chemically reacts with silicon of the exposed portion. The chemical reaction of the reactive gas and the silicon proceeds at basically the same speed in all directions, and a volatile material is produced by the chemical reaction. Accordingly, since the exposed silicon together with the portion thereof under the resist 300 is removed at the same speed for all directions, it is possible to form an isotropic etched groove 110 in the semiconductor wafer 100, which groove 110 has a cross-section that is bowl-shaped from the side viewpoint of the semiconductor wafer 100 as illustrated in FIG. 3. After the groove 110 is formed into a predetermined shape, the semiconductor chip fabrication apparatus moves to a third fabrication process.

Figure 4:
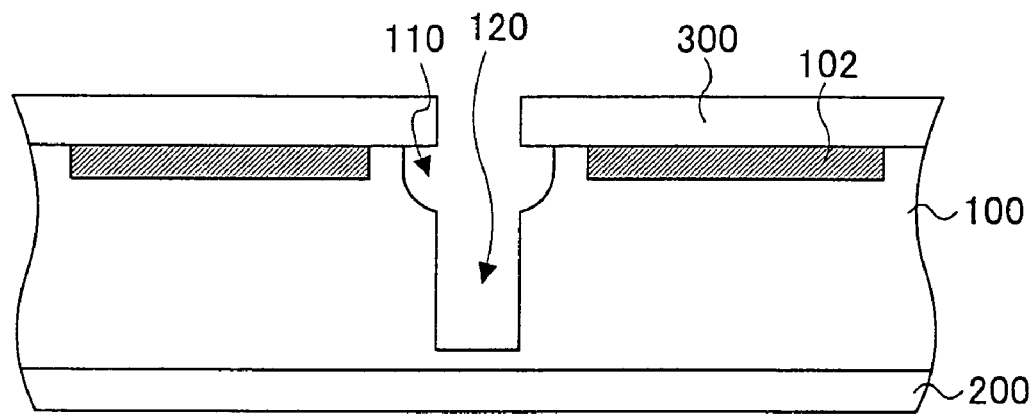
FIG. 4 is a diagram illustrating a third fabrication process of the semiconductor chip according to the embodiment.

FIG. 4 shows the third fabrication process for the semiconductor chip according to the embodiment of the present invention. In the third fabrication process, the semiconductor chip fabrication apparatus performs anisotropic etching on the exposed portion of the semiconductor wafer 100, that is, the cutting portion of the semiconductor wafer 100.

Specifically, the semiconductor chip fabrication apparatus implants ions and plasmas into the exposed portion of the semiconductor wafer 100 from above at a high speed. As a result, the silicon of the exposed portion is removed by the implanted ions and plasmas. The ions and plasmas are implanted in a direction from the upper side to the exposed portion of the semiconductor wafer 100. For this reason, the removal of the silicon proceeds in the direction from the upper side to the lower side of the semiconductor wafer 100. Consequently, it is possible to form an anisotropic etched groove 120 along the outer edges of the resists 300 as illustrated in FIG. 4. The groove 120 is formed such that each diced semiconductor chip has notched corners.

Figure 5:
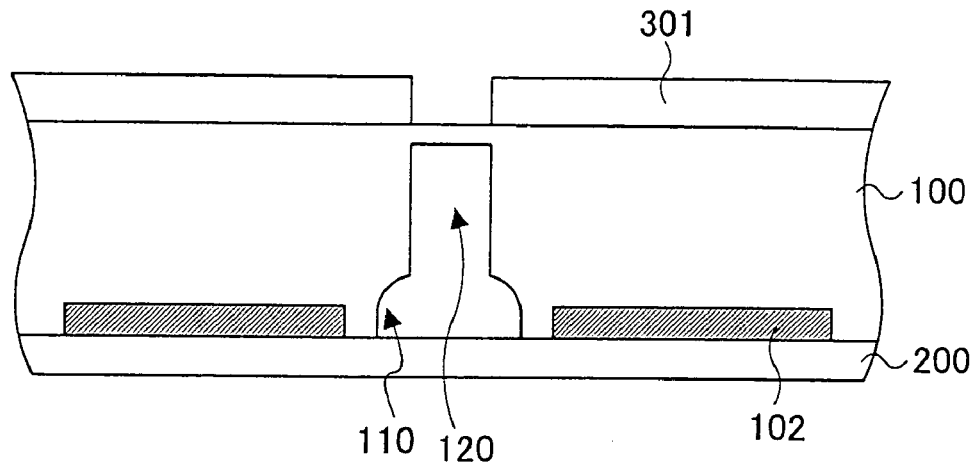
FIG. 5 is a diagram illustrating a fourth fabrication process of the semiconductor chip according to the embodiment.

FIG. 5 shows a fourth fabrication process for the semiconductor chip according to the embodiment of the present invention. In the fourth fabrication process, the semiconductor chip fabrication apparatus removes the resist 300 on the element formation surface of the semiconductor wafer 100 and then turns over the semiconductor wafer 100. Furthermore, the semiconductor chip fabrication apparatus fixes the semiconductor wafer 100 by attaching the element formation surface of the semiconductor wafer 100 to the tape 200.

Then, the semiconductor chip fabrication apparatus provides a resist film on the element non-formation surface as in the first fabrication process. By exposing the resist film to light, the semiconductor chip fabrication apparatus removes the resist film on the cutting portion of the semiconductor wafer 100. When the resist film on the cutting portion of the semiconductor wafer 100 is removed, resists 301 of which corners are rounded off can be formed like the resists 300 in FIG. 2, for example.

Figure 6:
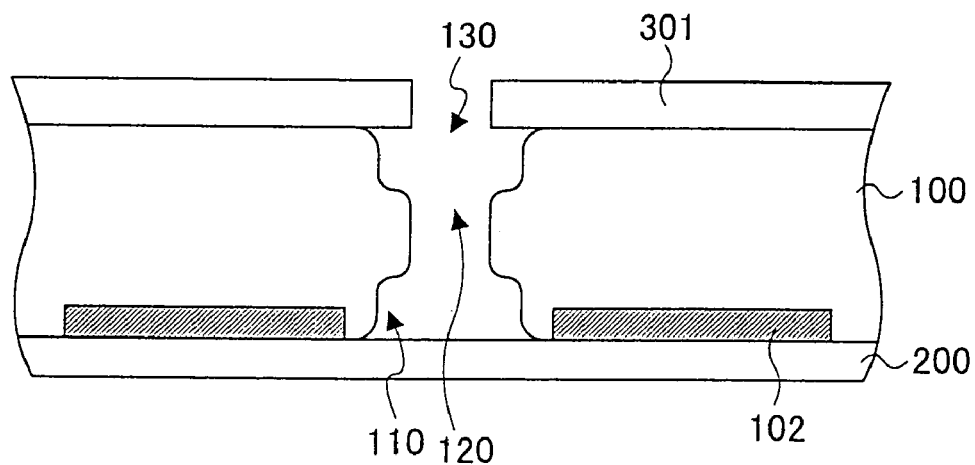
FIG. 6 is a diagram illustrating a fifth fabrication process of the semiconductor chip according to the embodiment.

FIG. 6 shows a fifth fabrication process for the semiconductor chip according to the embodiment of the present invention. In the fifth fabrication process, the semiconductor chip fabrication apparatus performs isotropic etching on the exposed portion of the semiconductor wafer 100, that is, the cutting portion of the semiconductor wafer 100. Specifically, since silicon of the exposed portion together with the portion of the semiconductor wafer 100 under the resist 301 is removed at basically the same speed in all directions, it is possible to form an isotropic etched groove 130, of which cross-section is bowl-shaped from the side viewpoint of the semiconductor wafer 100, as in the second fabrication process in FIG. 3. With the grooves 110, 120 and 130 thus formed in the semiconductor wafer 100, it is possible to form a semiconductor chip according to the embodiment of the present invention.

Figure 7:
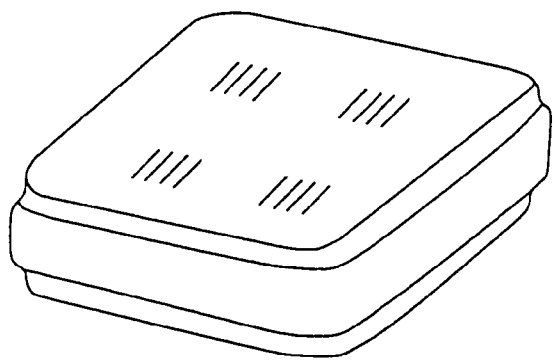
FIG. 7 is a perspective view of the semiconductor chip according to the embodiment.
Figure 8:
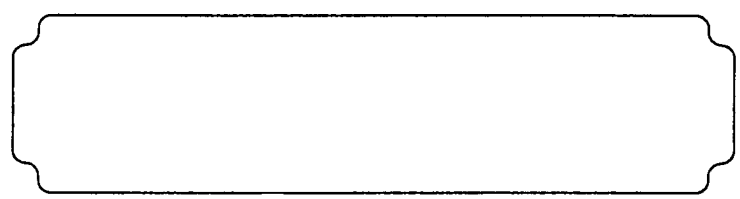
FIG. 8 is a cross-sectional view of the semiconductor chip according to the embodiment from a side viewpoint thereof.
Figure 9:
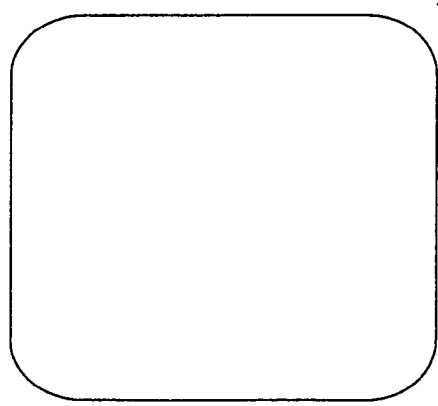
FIG. 9 is a cross-sectional view of the semiconductor chip according to the embodiment from a top viewpoint thereof.

FIG. 7 is a perspective view of a semiconductor chip 500 according to an embodiment of the present invention. FIG. 8 is a cross-sectional view of the semiconductor chip 500 from the side thereof. FIG. 9 is a cross-sectional view of the semiconductor chip 500 from the upper side thereof. As seen in these figures, edges of the semiconductor chip 500 are notched or rounded off.

In the above-mentioned anisotropic and isotropic etching, $SF_6$ can be used, for example, as the reactive gas. When isotropic or anisotropic dry etching such as plasma etching or sputter etching is performed by adjusting the pressure of the reactive gas or a voltage applied to electrodes, it is possible to obtain a desired etching shape.

In this manner, the semiconductor chip fabrication method according to the embodiment of the present invention employs isotropic etching and anisotropic etching to etch the surfaces of the semiconductor wafer 100. As a result, it is possible to reduce the dicing time for the semiconductor wafer 100, that is, the fabrication time of the semiconductor chip 500. In addition, it is unnecessary to prepare the dicing line width corresponding to the width of a dicing blade and shorten the dicing line width unlike in the case where the dicing blade is used to dice the semiconductor wafer 100. As a result, it is possible to enhance integration of the semiconductor chips 500 on the semiconductor wafer 100, that is, it is possible to produce more semiconductor chips 500 from the semiconductor wafer 100. In addition, since isotropic etching is performed for the cutting portion from both of the element formation surface and the element non-formation surface of the semiconductor wafer 100, it is possible to form semiconductor chips 500 having rounded-off outer edges with respect to both of the element formation surface and the element non-formation surface. As a result, chipping of the outer edges can be prevented when the semiconductor chips 500 are handled, and, accordingly, it is possible to improve yield of the semiconductor chips 500. In addition, anisotropic etching is performed to round off corners of each resist 300 on an element formation surface and corners of each resist 301 on an element non-formation surface from the upper side of the cutting portion of the semiconductor wafer 100. Accordingly, it is possible to round off outer edges of side surfaces of the semiconductor chip 500. As a result, chipping of the outer edges can be prevented when the semiconductor chip 500 is handled, and, accordingly, it is possible to improve yield of the semiconductor chips 500.

In the above-mentioned embodiment, isotropic etching is performed for cutting portions of the element formation surface and the element non-formation surface of the semiconductor wafer 100. In an alternative embodiment, the isotropic etching may be performed for the cutting portion from only one of the element formation surface and the element non-formation surface. In such case, anisotropic etching is performed in the third fabrication process in FIG. 4 until the semiconductor wafer 100 is cut. Also, when a pickup tool of the semiconductor chip fabrication apparatus picks up a semiconductor chip 500, the semiconductor chip fabrication apparatus operates the pickup tool to seize the surface whose outer edge is notched. As a result, it is possible to prevent chipping of the outer edge during handling. In addition, since an isotropic etching is performed for only one of the cutting portions of the element formation surface and the element non-formation surface, it is possible to further reduce the dicing time for the semiconductor wafer 100.

The present invention is not limited to the specifically disclosed embodiments, and variations and modifications may be made without departing from the scope of the present invention.

The present application is based on Japanese Patent Priority Application No. 2002-256767 filed Sep. 2, 2002, the entire contents of which are hereby incorporated by reference.

What is claimed is:

1. A method of fabricating a semiconductor chip from a semiconductor wafer having a first surface supporting a semiconductor element and a second surface opposite the first surface, the method comprising the steps of:
    forming a resist on one or both of the first surface and the second surface, the resist including an aperture for exposing a cutting portion of the semiconductor wafer;
    performing isotropic etching on the exposed cutting portion via the aperture of the resist, thereby forming a groove having a bowl-shaped cross-section, the groove including an aperture having a width greater than the width of the aperture of the resist; and
    performing anisotropic etching on a bottom surface of the groove via the aperture of the resist in such a way that a width of a resulting aperture on the bottom surface becomes smaller than the width of the aperture of the groove, thereby separating the semiconductor wafer into individual semiconductor elements.

2. The method as claimed in claim 1, further comprising the step of:
    forming a resist on the first surface to expose the cutting portion on the first surface, when the cutting portion is isotropically etched from the first surface.

3. The method as claimed in claim 2, wherein the resist has rounded-off corners.

4. The method as claimed in claim 1, further comprising the step of:
    forming a resist on the second surface to expose the cutting portion on the second surface, when the cutting portion is isotropically etched from the second surface.

5. The method as claimed in claim 4, wherein the resist has rounded-off corners.

6. A method of fabricating a semiconductor chip from a semiconductor wafer having a first surface supporting a semiconductor element and a second surface opposite the first surface, the method comprising the steps of:
    performing isotropic etching on a cutting portion of the semiconductor wafer from one of the first surface and the second surface, thereby forming a first groove having a bowl-shaped cross-section;
    performing anisotropic etching on a bottom surface of the first groove, thereby forming a second groove; and
    performing isotropic etching on a cutting portion of the semiconductor wafer from the other surface, thereby forming a third groove coupled to the second groove, the third groove having a bowl-shaped cross-section, and thereby separating the semiconductor wafer into individual semiconductor elements.

* * * * *